(12) United States Patent
Wu et al.

(10) Patent No.: US 9,257,955 B2
(45) Date of Patent: Feb. 9, 2016

(54) COMMON MODE NOISE REDUCTION CIRCUIT

(71) Applicant: NATIONAL TAIWAN UNIVERSITY, Taipei (TW)

(72) Inventors: Tzong-Lin Wu, Taipei (TW); Chih-Ying Hsiao, Taipei (TW)

(73) Assignee: National Taiwan University, Taipei (TW)

( * ) Notice: Subject to any disclaimer, the term of this patent is extended or adjusted under 35 U.S.C. 154(b) by 14 days.

(21) Appl. No.: 14/474,714

(22) Filed: Sep. 2, 2014

(65) Prior Publication Data
US 2015/0318834 A1    Nov. 5, 2015

(30) Foreign Application Priority Data
May 2, 2014  (TW) .............................. 103115819 A (51) Int. Cl.
*H01P 5/12* (2006.01)
*H03H 1/00* (2006.01)

(52) U.S. Cl.
CPC .................................. *H03H 1/0007* (2013.01)

(58) Field of Classification Search
CPC ....... H03H 1/0007; H03H 7/09; H03H 7/075; H03H 7/175–7/1791
USPC .................................................. 333/100, 181
See application file for complete search history.

(56) References Cited

U.S. PATENT DOCUMENTS

| | | | | | |
|---|---|---|---|---|---|
| 4,667,173 | A | * | 5/1987 | Okochi | H02M 1/14 333/168 |
| 4,760,231 | A | * | 7/1988 | Hayashi | H03H 7/0115 219/660 |
| 4,888,675 | A | * | 12/1989 | Kumar | H02M 1/14 333/181 |
| 5,483,136 | A | * | 1/1996 | Marcinkiewicz | H02M 1/44 318/558 |
| 6,631,693 | B2 | | 10/2003 | Hilliker | |
| 7,312,971 | B2 | | 12/2007 | Terada | |
| 7,323,955 | B2 | | 1/2008 | Jachowski | |
| 7,397,646 | B2 | | 7/2008 | Terada | |
| 7,576,965 | B2 | | 8/2009 | Terada et al. | |
| 7,589,947 | B2 | | 9/2009 | Terada | |

(Continued)

FOREIGN PATENT DOCUMENTS

| | | |
|---|---|---|
| CN | 102365784 A | 2/2012 |
| TW | I303478 | 11/2008 |

(Continued)

OTHER PUBLICATIONS

Matthew A. Morgan, Theoretical and Experimental Study of a New Class of Reflectionless Filter, IEEE Transactions on Microwave Theory and Techniques, vol. 59, No. 5, May 2011, pp. 1214-1221.

*Primary Examiner* — Robert Pascal
*Assistant Examiner* — Kimberly Glenn
(74) *Attorney, Agent, or Firm* — Rosenberg, Klein & Lee (57) ABSTRACT

A common mode noise reduction circuit includes at least one first input end, at least one second input end, at least one first output end, and at least one second output end. The circuit is further provided with at least one resistor, at least one inductor, and at least one capacitor, symmetrically disposed within the circuit loop defined by the four ends. Common mode noise, after entering the circuit, is transformed into heat by the resistance of the circuit such that the common mode noise is suppressed. Differential mode signals, on the contrary, after entering the circuit, can pass through the circuit with minimum loss.

16 Claims, 8 Drawing Sheets

(56) References Cited

U.S. PATENT DOCUMENTS

| | | |
|---|---|---|
| 7,606,018 B2 | 10/2009 | Ishii et al. |
| 7,821,759 B2 | 10/2010 | Terada |
| 8,305,164 B1 | 11/2012 | Jachowski |
| 8,392,495 B2 | 3/2013 | Morgan |
| 8,847,705 B2 * | 9/2014 | Kameya ............... H03H 7/427 333/12 |
| 2006/0114634 A1 | 6/2006 | Terada |
| 2006/0126239 A1 | 6/2006 | Terada |
| 2006/0291128 A1 | 12/2006 | Terada |
| 2007/0019353 A1 | 1/2007 | Ishii et al. |
| 2007/0025043 A1 | 2/2007 | Terada et al. |
| 2007/0188266 A1 * | 8/2007 | Kebinger ............... H03H 7/09 333/181 |
| 2008/0174387 A1 * | 7/2008 | Chiang ............... H03H 1/0007 333/167 |
| 2008/0192401 A1 | 8/2008 | Terada |
| 2010/0205233 A1 | 8/2010 | Morgan |
| 2010/0277256 A1 * | 11/2010 | Concord ............... H01P 1/2007 333/177 |
| 2011/0199751 A1 * | 8/2011 | Ho ............... H03H 7/427 361/818 |
| 2011/0234337 A1 * | 9/2011 | Saitou ............... H03H 7/427 333/175 |
| 2014/0266507 A1 * | 9/2014 | Fauer ............... H02M 1/10 333/181 |
| 2014/0306787 A1 * | 10/2014 | Kato ............... H01F 17/0013 336/105 |
| 2015/0021994 A1 * | 1/2015 | Bojarski ............... H03H 7/427 307/31 |

FOREIGN PATENT DOCUMENTS

| | | |
|---|---|---|
| TW | I303507 | 11/2008 |
| TW | I310629 | 6/2009 |
| TW | I312233 | 7/2009 |
| TW | I335116 | 12/2010 |

* cited by examiner

COMMON MODE NOISE REDUCTION CIRCUIT

CROSS REFERENCE TO RELATED APPLICATIONS

This non-provisional application claims priority claim under 35 U.S.C. §119(a) on Taiwan Patent Application No. 103115819 filed May 2, 2014, the entire contents of which are hereby incorporated by reference.

BACKGROUND

1. Technical Field

The present disclosure relates to a common mode noise reduction circuit and, more particularly, to a common mode noise reduction circuit for suppressing common mode noise while maintaining the differential mode signals with minimum loss.

2. Description of Related Art

The advance of technology has driven faster operation speed and clock frequency for digital circuits such that the techniques of differential microstrips and striplines are widely applied in high-speed data transmission applications. Ideally, a differential transmission line has the characteristics of low electromagnetic radiation, and low crosstalk. However, in an actual circuit, unbalanced (or asymmetric) structure may inevitably carry unwanted common mode noise attached to the differential signals.

In general, it is needed to design a circuit with asymmetrical wiring in order to reduce the layout area. Any by-pass, feed-through, or slots on the circuit board may cause discontinuity problem, and generate unbalance in terms of amplitudes and phases when outputting signals. The problem is that the asymmetrical circuit structure may adversely convert differential mode signals into common mode noise, where the common mode noise is carried, through the ground contact, to the border of the circuit, the connected wires, or the metal layer of shielding, and worse yet, the common mode noise may cause serious electromagnetic interference, an impact to the radio frequency of the circuit or the antenna operation.

Figure 1:
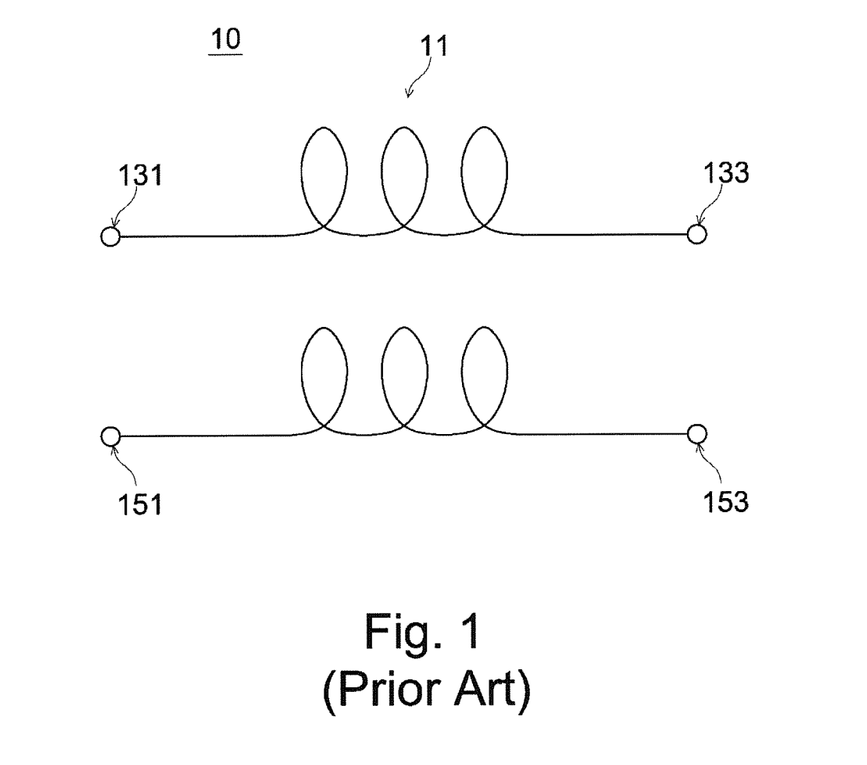
FIG. 1 is a circuit diagram of a common mode noise reduction circuit in the art.

Referring to FIG. 1, a circuit diagram of a common mode noise suppression circuit 10 in the art is shown. The circuit 10 includes a common mode choke 11, a first input end 131, a first output end 133, a second input end 151, and a second output end 153. The circuit 10 suppresses common mode noise by generating high inductive impedance for the common mode noise via the common mode choke, which is made of magnetic material. However, the permeability of the magnetic common mode choke 11 attenuates quickly in high frequency section, a limitation that makes the common mode choke 11 not suitably applied in high-speed transmission interface with frequency section of GHz or above.

SUMMARY

An object of the present disclosure is to provide a common mode noise reduction circuit in which at least one resistor is provided to increase the loss with respect to common mode signals such that the common mode signals will not release from either input ends or output ends, thereby suppressing the common mode signals.

Another object of this disclosure is to provide a common mode noise reduction circuit in which the circuit includes at least one first input end, at least one second input end, at least one first output end, and at least one second output end. The circuit is provided with at least one resistor, at least one inductor, and at least one capacitor, symmetrically connected to the four ends, such that common mode signals, after entering the circuit, are transformed into heat, while differential mode signals, after entering the circuit, pass through the circuit without any loss.

Another object of this disclosure is to provide a common mode noise reduction circuit in which the circuit is symmetrically structured such that the differential mode signals entering the circuit are maintained without any loss.

Another object of this disclosure is to provide a common mode noise reduction circuit in which the circuit includes a first transmission line, a second transmission line, a first connection line, a second connection line, and a third connection line. The two ends of the first connection line, as well as the two ends of the second connection line, are respectively connected to the first transmission line and the second transmission line. The two ends of the third connection line are respectively connected to the first connection line and the second connection line, such that the first transmission line and the second transmission are symmetric to each other about the third connection line.

To the objects, this disclosure provides a common mode noise reduction circuit which includes a first transmission line, a second transmission line, a first connection line, a second connection line, and a third connection line. The first transmission line includes: a first input end; a first output end; and at least one first inductor disposed between the first input end and the first output end. The second transmission line includes: a second input end; a second output end; and at least one second inductor disposed between the second input end and the second output end. The first connection line is connected to the first input end and the second input end and includes at least one first two-port element and at least one second two-port element, where the first two-port element and the second two-port element are connected in series, and a third inductor is disposed between the first two-port element and the second two-port element and connected to the ground end. The second connection line is connected to the first output end and the second output end and includes at least one third two-port element and at least one fourth two-port element, where the third two-port element and the fourth two-port element are connected in series, and a fourth inductor is disposed between the third two-port element and the fourth two-port element and connected to the ground end. The third connection line includes at least one first resistor and at least one second resistor, where the first resistor and the second resistor are connected in series. The third connection line has one end connected between the first two-port element and the second two-port element connected in series, and has the other end connected between the third two-port element and the fourth two-port element connected in series. A fifth two-port element is disposed between the first resistor and the second resistor connected in series and connected to the ground end. The first two-port element, the second two-port element, the third two-port element, the fourth two-port element, and the fifth two-port element each have capacitive characteristics.

Furthermore, this disclosure provides another common mode noise reduction circuit which includes a first transmission line, a second transmission line, a first connection line, a second connection line, and a third connection line. The first transmission line includes: a first input end; a first output end; and a plurality of first inductors connected in series and disposed between the first input end and the first output end. The second transmission line includes: a second input end; a second output end; a plurality of second inductors connected in series and disposed between the second input end and the second output end. The first connection line is connected to the first input end and the second input end and includes at least one first two-port element and at least one second two-port element, where the first two-port element and the second two-port element are connected in series, and a third inductor is disposed between the first two-port element and the second two-port element and connected to the ground end. The second connection line is connected to the first output end and the second output end and includes at least one third two-port element and at least one fourth two-port element, where the third two-port element and the fourth two-port element are connected in series, and a fourth inductor is disposed between the third two-port element and the fourth two-port element and connected to the ground end. The third connection line includes at least one first resistor and at least one second resistor connected in series. The third connection line has one end connected between the first two-port element and the second two-port element connected in series, and has the other end connected between the third two-port element and the fourth two-port element connected in series. A fifth two-port is disposed between the first resistor and the second resistor and connected in series and connected to the ground end. The first two-port element, the second two-port element, the third two-port element, the fourth two-port element, and the fifth two-port element each have capacitive characteristics.

In one embodiment, the first two-port element, the second two-port element, the third two-port element, the fourth two-port element, the fifth two-port element and/or the sixth two-port element are a capacitor or diode.

In one embodiment, the first transmission line, the first two-port element, and the third two-port element combined are referred to as a first block, and the second transmission line, the second two-port element, and the fourth two-port element combined are referred to as a second block. The first block and the second block are symmetric to each other about the third connection line.

In one embodiment, the first connection line includes a first node connected to the ground end via the third inductor, and two sides of the first node are respectively provided with equal numbers of the first two-port elements and the second two-port elements; the second connection line includes a second node connected to the ground end via the fourth inductor, and two sides of the second node are respectively provided with the numbers of the third two-port elements and the fourth two-port elements.

In one embodiment, the two ends of the third connection line are respectively connected to the first node and the second node.

In one embodiment, the third connection line includes a third node connected to the ground end via the fifth two-port element, and two sides of the third node are respectively provided with equal numbers of the first resistors and the second resistors.

In one embodiment, this circuit further includes at least one fourth connection line provided with at least one sixth two-port element. One end of the fourth connection line is connected between the first inductors of the first transmission line, and the other end of the fourth connection line is connected between the second inductors of the second transmission line.

In one embodiment, the number of the first inductors and the number of the second inductors are three or more than three, and the number of the fourth connection lines is one less than the number of the first inductors or the second inductors. Moreover, one end of the fourth connection line is connected between two adjacent first inductors of the first transmission line, and the other end of the fourth connection line is connected between two adjacent second inductors of the second transmission line.

BRIEF DESCRIPTION OF THE DRAWINGS

The structure as well as a preferred mode of use, further objects, and advantages of this disclosure will be best understood by referring to the following detailed description of some illustrative embodiments in conjunction with the accompanying drawings, in which.

DETAILED DESCRIPTION OF THE PREFERRED EMBODIMENTS

Figure 2:
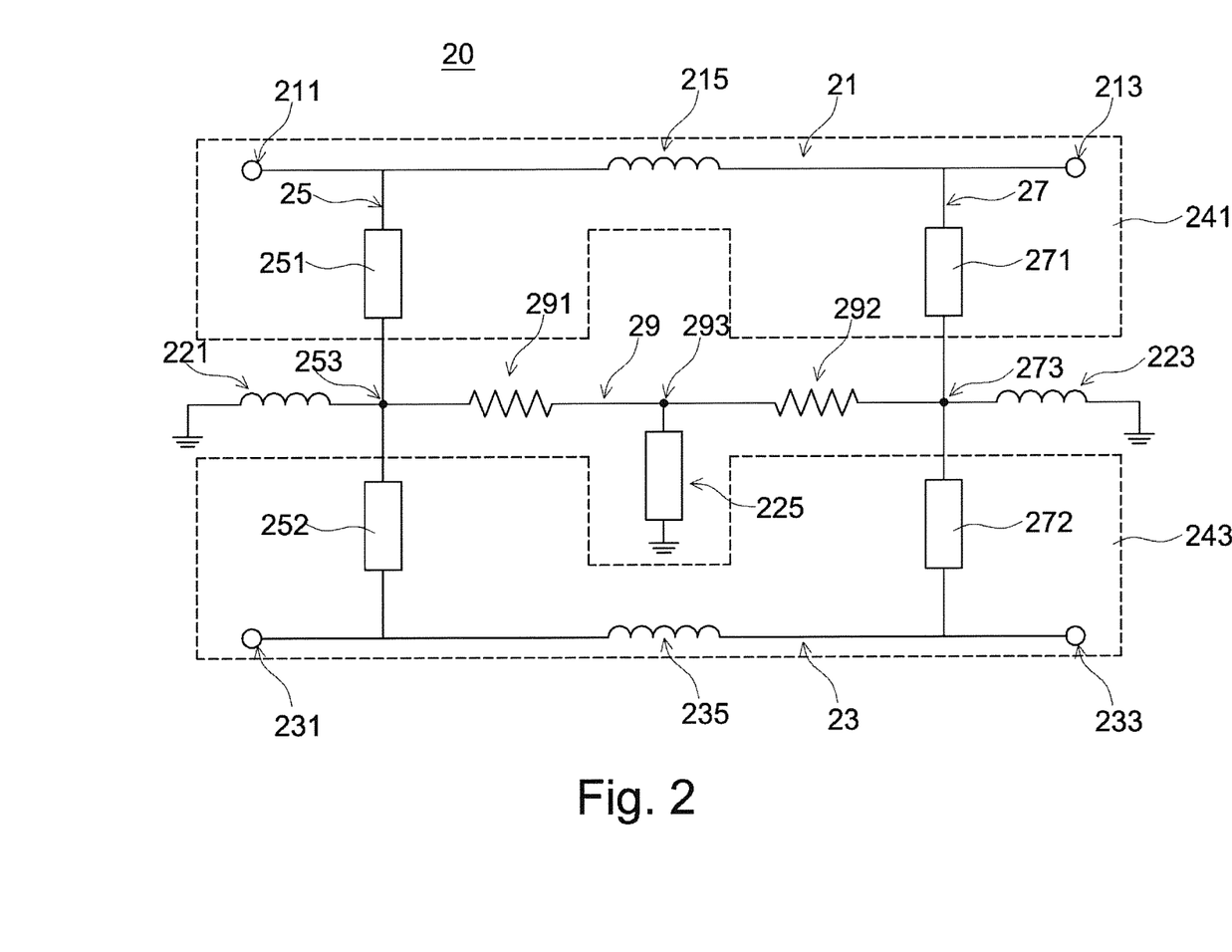
FIG. 2 is a circuit diagram of a common mode noise reduction circuit according to an embodiment of this disclosure.

Referring to FIG. 2, a common mode noise reduction circuit according to an embodiment of this disclosure is shown. The common mode noise reduction circuit 20 includes a first transmission line 21, a second transmission line 23, a first connection line 25, a second connection line 27, and a third connection line 29. The first transmission line 21 includes a first input end 211 and a first output end 213, and the second transmission line 23 includes a second input end 231 and a second output end 233.

In the present embodiment, there provides at least one inductor 215 disposed between the first input end 211 of the first transmission line 21 and the first output end 213 of the first transmission line 21, and there provides at least one inductor 235 disposed between the second input end 231 of the second transmission line 23 and the second output end 233 of the second transmission line 23. In one embodiment, the first inductor 215 and the second inductor 235 may have the same inductance value. In one embodiment, one of the first inductors 215 of the first transmission line 21 and one of the second inductors 235 of the second transmission line 23 are mutual inductively coupled.

The first connection line 25 serves to connect between the first transmission line 21 and the second transmission line 23, where the two ends of the first connection line 25 are respectively connected to the first input end 211 and the second input end 231. The first connection line 25 includes at least one first two-port element 251 and at least one second two-port element 252, where the first two-port element 251 and the second two-port element 252 are connected in series, and a third inductor 221 is disposed between the first two-port element 251 and the second two-port element 253 and connected to the ground end. For example, the connection between the first two-port element 251 and the second two-port element 252 is referred to as the first node 253 and the first node 253 is connected to the ground end via the third inductor 221. In some embodiments, the numbers of the first two-port elements 251 and the second two-port elements 252 may be more than two, and the equal numbers of the first two-port elements 251 and the second two-port elements 25 are respectively disposed at two sides of the first node 253. In one embodiment, the first two-port element 251 and the second two-port element 252 may be the same component which, for example, is a capacitor or diode.

The second connection line 27 serves to connect between the first transmission line 21 and the second transmission line 23, where the two ends of the second connection line 27 are respectively connected to the first output end 213 and the second output end 233. The first connection line 27 includes at least one third two-port element 271 and at least one fourth two-port element 272, where the third two-port element 271 and the fourth two-port element 272 are connected in series, and a fourth inductor 223 is disposed between the third two-port element 271 and the fourth two-port element 272 and connected to the ground end. For example, the connection between the third two-port element 271 and the fourth two-port element 272 is referred to as the second node 273 and the second node 273 is connected to the ground end via the third inductor 223. In some embodiments, the numbers of the third two-port elements 271 and the fourth two-port elements 272 may be more than two, and the equal numbers of the third two-port elements 271 and the fourth two-port elements 272 are respectively disposed at the two sides of the second node 273. In one embodiment, the third two-port element 271 and the fourth two-port element 272 may be the same component which, for example, is a capacitor or diode.

The third connection line 29 serves to connect between the first connection line 25 and the second connection line 27, where one end of the third connection line 29 is connected between the first two-port element 251 and the second two-port element 252, and the other end of the third connection line 29 is connected between the third two-port element 271 and the fourth two-port element 272. For example, the third connection line 29 has one end connected to the first node 253, and has the other end connected to the second node 273.

In one embodiment, the third connection line 29 includes at least one first resistor 291 and at least one second resistor 292, where the first resistor 291 and the second resistor 292 are connected in series, and a fifth two-port element 225 is disposed between the first resistor 291 and the second resistor 292 and connected to the ground end. For example, the connection between the first resistor 291 and the second resistor 292 is referred to as the third node 293 and the third node 293 is connected to the ground end via the fifth two-port element inductor 225. The numbers of the first resistors 291 and the second resistors 292 may be more than two, and the equal numbers of the first resistors 291 and the second resistors 292 are respectively disposed at the two sides of the third node 293.

In the present embodiment, the first transmission line 21 and the second transmission line 23 are disposed in symmetry which, for example, are symmetric about the third connection line 29. According to the orientation shown in FIG. 2, the first transmission line 21, and the first two-port element 251 and the third two-port element 271, which are disposed above the third connection line 29, can be referred to as the first block 241, and the second transmission line, and the second two-port element 252 and the fourth two-port element 272, which are disposed below the third connection line 29, can be referred to as the second block 243. The first block 241 and the second block 243 are symmetric to each other about the third connection line 29. The term of "symmetric," as indicated in the embodiment, refers to a symmetry of elements in the circuit, where the element can be, for example, an inductor, capacitor, resistor, or diode, but the number of elements which are symmetric may not be the same.

According to the law of conservation of energy, the energy of common mode signals should comply with the following equation:

$$1 = |Scc11|^2 + |Scc21|^2 + |Sdc11|^2 + |Sdc21|^2 + \delta \quad (1),$$

where $|Scc11|$ dB refers to the return loss of the common mode signals; $|Scc21|$ dB refers to the insertion loss of the common mode signals; $|Sdc11|$ and $|Sdc21|$ refer to the mode conversion from common mode energy to differential mode energy; and $\delta$ refers to the loss with respect to the common mode signals, where the loss may be attributed to the metal wire, the material substrate, or the circuit.

In general, a common mode reduction circuit is symmetrically constructed. For example, in this embodiment, the first transmission line 21 and the second transmission line 23 (i.e., the first block 241 and the second block 243) are symmetric to each other about the third connection line 29. Hence, the mode conversion, $|Sdc11|$ and $|Sdc21|$, are negligible, allowing Eq. (1) to be simplified as follows:

$$1 = |Scc11|^2 + |Scc21|^2 + \delta \quad (2)$$

Since the loss ($\delta$) caused by the metal wire and material substrate is negligible in a conventional common mode reduction circuit, Eq. (2) may be further simplified as follows:

$$1 = |Scc11|^2 + |Scc21|^2 \quad (3)$$

As indicated in Eq. (3), if the operation of a conventional common mode noise reduction circuit is to avoid the common mode signals to pass through the circuit, the term $|Scc21|$ should be as close to 0 as possible, making the term $|Scc11|$ approach to 1, which means that the common mode signals will be returned. However, the returned common mode signals are unexpected, and may be radiated by other radioactive objects, thereby adversely interfering with the radio frequency of the circuit or the operation of the antenna.

In this embodiment, the first transmission line 21 and the second transmission line 23 (i.e., the first block 241 and the second block 243) are symmetric to each other, and therefore the common mode noise reduction circuit 20 causes no, or only minimum, loss with respect to the differential mode signals, when inputting to the first input end 211 and the second input end 231 and outputting from the first output end 213 and the second output end 233. By incorporating the first resistor 291 and the second resistor 292 in the common mode noise reduction circuit 20, the common mode signals, after entering the circuit, will be transformed into heat.

In Eq. (2), as the value of $\delta$ increases, both $|Scc11|$ and $|Scc21|$ decrease. For example, if the value of $\delta$ approaches to 1, both $|Scc11|$ and $|Scc21|$ approach to 0 accordingly. In other words, the common mode signals, after entering the common mode noise reduction circuit 20, will not output from the first input end 211 or the first output end 213, thereby suppressing the common mode noise. The same theory can be applied to the second input end 231 and the second output 233.

Figure 3:
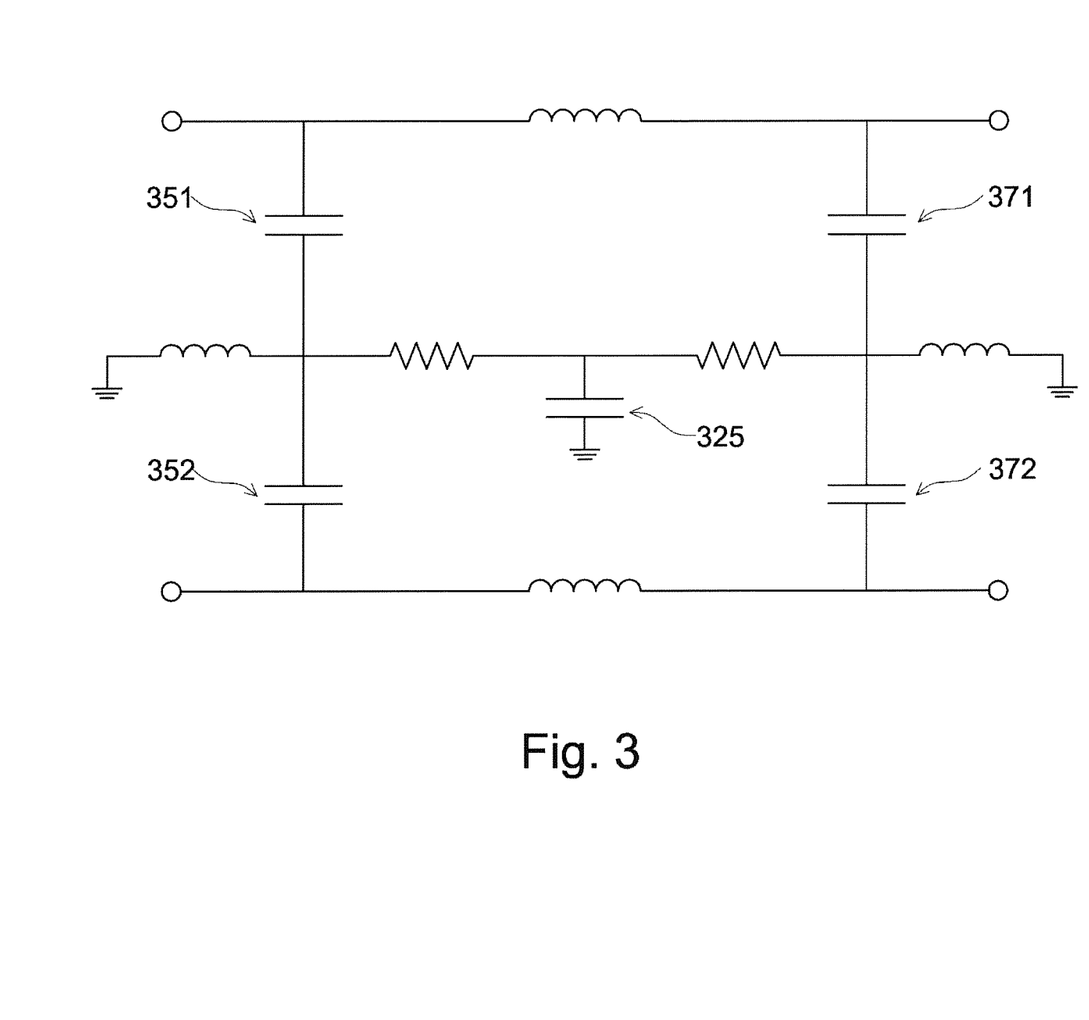
FIG. 3 is a circuit diagram of a common mode noise reduction circuit according to another embodiment of this disclosure.
Figure 4:
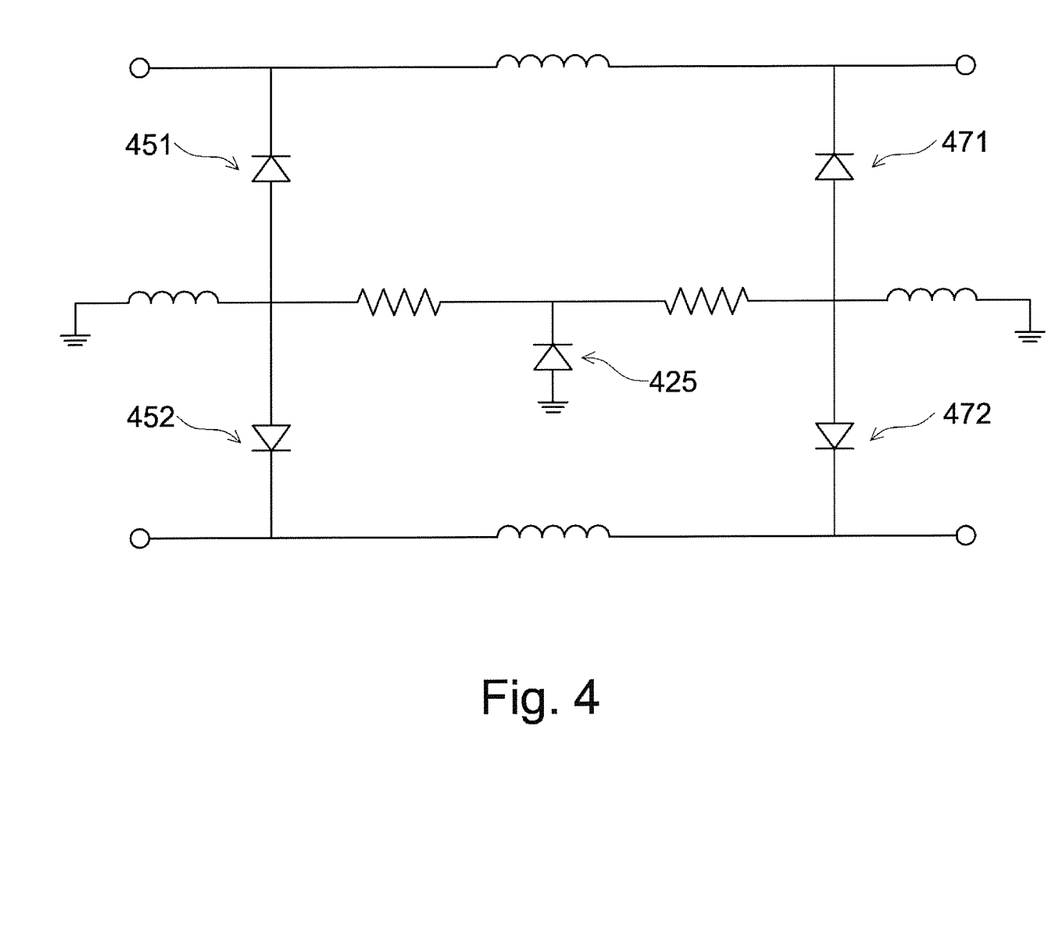
FIG. 4 is a circuit diagram of a common mode noise reduction circuit according to another embodiment of this disclosure.

In this embodiment, the first two-port element 251, the second two-port element 252, the third two-port element 271, the fourth two-port element 272, and the fifth two-port element 225 have a capacitive characteristic which may, for example, be a capacitor or diode. In one embodiment, the first two-port element 251, the second two-port element 252, the third two-port element 271, the fourth two-port element 272, and the fifth two-port element 225 are the first capacitor 351, the second capacitor 352, the third capacitor 371, the fourth capacitor 372, and the fifth capacitor 325, respectively, as shown in FIG. 3, where the first capacitor 351, the second capacitor 352, the third capacitor 371, the fourth capacitor 372, and the fifth capacitor 325 may, or may not, have the same capacitance. In another embodiment, the first two-port element 251, the second two-port element 252, the third two-port element 271, the fourth two-port element 272, and the fifth two-port element 225 are the first diode 451, the second diode 452, the third diode 471, the fourth diode 472, and the fifth diode 425, respectively, as shown in FIG., where the first diode 451, the second diode 452, the third diode 471, the fourth diode 472, and the fifth diode 425 may, or may not, have the same diode. In practice, without affecting the common mode noise reduction circuit 20, the first two-port element 251, the second two-port element 252, the third two-port element 271, the fourth two-port element 272, and the fifth two-port element 225 may be selected from either a capacitor or a diode.

Figure 5:
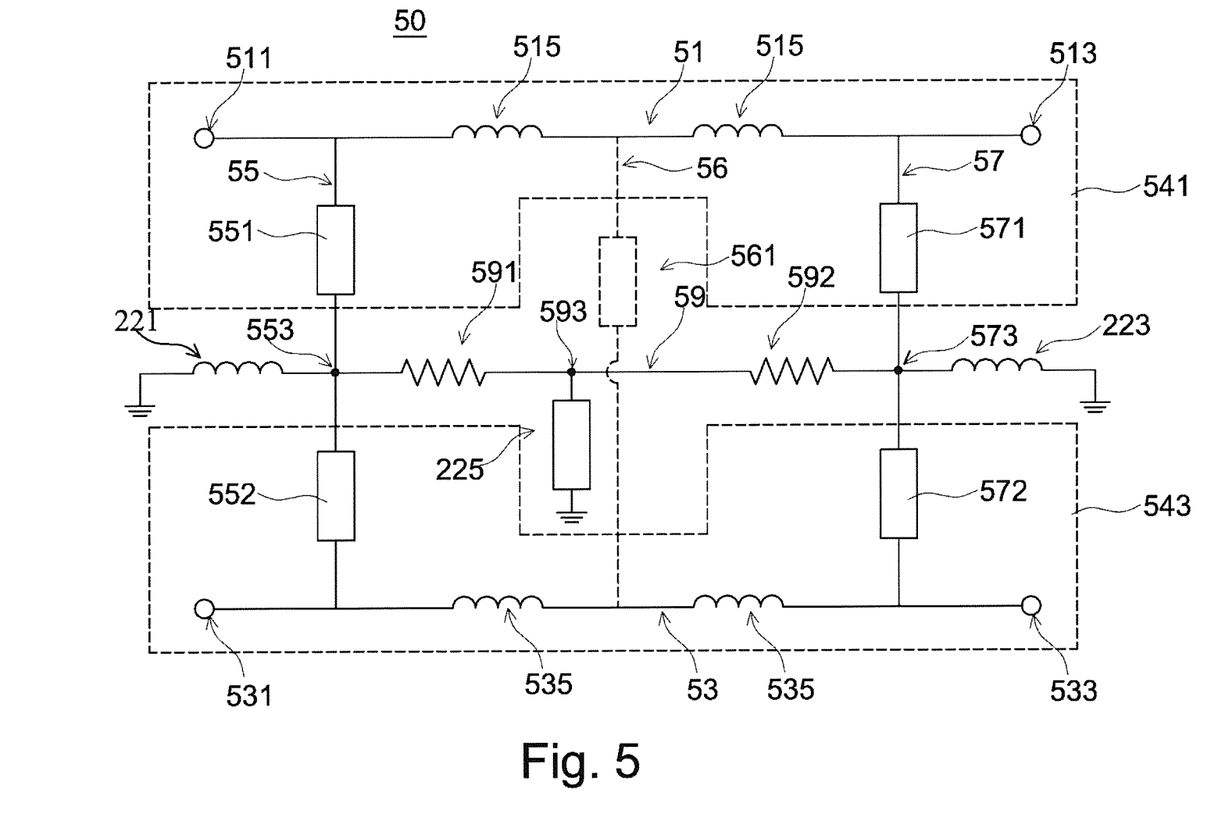
FIG. 5 is a circuit diagram of a common mode noise reduction circuit according to another embodiment of this disclosure.

Referring to FIG. 5, a common mode noise reduction circuit according to another embodiment of this disclosure is shown. The common mode noise reduction circuit 50 includes a first transmission line 51, a second transmission line 53, a first connection line 55, a second connection line 57, and a third connection line 59, where the first transmission line 51 includes a first input end 511 and a first output end 513, and the second transmission line 53 includes a second input end 531 and a second output end 533.

In this embodiment, there provides plural first inductors 515 disposed between the first input end 511 of the first transmission line 51 and the first output end 513 of the first transmission line 51, where the first inductors 515 are connected in series, and there provides plural second inductors 535 disposed between the second input end 531 of the second transmission line 53 and the second output end 533 of the second transmission line 53, where the second inductors 535 are connected in series. In one embodiment, the first inductors 515 and the second inductors 535 may have the same inductance. In one embodiment, the first inductors 515 and the second inductors 535 may be mutual inductively coupled.

The first connection line 55 serves to connect between the first transmission line 51 and the second transmission line 53, where the two ends of the first connection line 55 are respectively connected to the first input end 511 and the second input 531. The first connection line 55 includes at least one first two-port element 551 and at least one second two-port element 552, where the first two-port element 551 and the second two-port element 552 are connected in series, and a third inductor 221 is disposed between the first two-port element 551 and the second two-port element 552 and connected to the ground end. For example, the connection between the first two-port element 551 and the second two-port element 552 is referred to as the first node 553 and the first node 553 is connected to the ground end via the third inductor 221. In some embodiments, the numbers of the first two-port element 551 and the second two-port element 552 may be more than two, and the equal numbers of the first two-port elements 551 and the second two-port element 552 are respectively disposed at the two sides of the first node 553. In one embodiment, the first two-port element 551 and the second two-port element 552 may be the same component which, for example, is a capacitor or diode.

The second connection line 57 serves to connect between the first transmission line 51 and the second transmission line 53, where the two ends of the second connection line 57 are respectively connected to the first output end 513 and the second output 533. The second connection line 57 includes at least one third two-port element 571 and at least one fourth two-port element 572, where the third two-port element 571 and the fourth two-port element 572 are connected in series, and a fourth inductor 223 is disposed between the third two-port element 571 and the fourth two-port element 572 and connected to the ground end. For example, the connection between the third two-port element 571 and the fourth two-port element 572 is referred to as the second node 573 and the second node 573 is connected to the ground end via the fourth inductor 223. In some embodiments, the numbers of the third two-port element 571 and the fourth two-port element 572 may be more than two, and the equal numbers of the third two-port elements 571 and the fourth two-port element 572 are respectively disposed at the two sides of the second node 573. In one embodiment, the third two-port element 571 and the fourth two-port element 572 may be the same component which, for example, is a capacitor or diode.

The third connection line 59 serves to connect between the first connection line 55 and the second connection line 57, where one end of the third connection line 59 is connected between the first two-port element 551 and the second two-port element 552, and the other end of the third connection line 59 is connected between the third two-port element 571 and the fourth two-port element 572. For example, the third connection line 59 has one end connected to the first node node 553, and has the other end connected to the second node 573.

In one embodiment, the third connection line 59 includes at least one first resistor 591 and at least one second resistor 592, where the first resistor 591 and the second resistor 592 are connected in series, and a fifth two-port element 225 is disposed between the first resistor 291 and the second resistor 292 and connected to the ground end. For example, the connection between the first resistor 591 and the second resistor 592 is referred to as the third node 593 and the third node 293 is connected to the ground end via the fifth two-port element inductor 225. The numbers of the first resistors 591 and the second resistors 592 may be more than two, and the equal numbers of the first resistors 591 and the second resistors 592 are respectively disposed at the two sides of the third node 593.

In the present embodiment, the first transmission line 51 and the second transmission line 53 are disposed in symmetry which, for example, are symmetric about the third connection line 59. According to the orientation shown in FIG. 5, the first transmission line 51, and the first two-port element 551 and the third two-port element 571, which are disposed above the third connection line 59, can be referred to as the first block 541, and the second transmission line 53, and the second two-port element 552 and the fourth two-port element 572, which are disposed below the third connection line 59, can be referred to as the second block 543. The first block 541 and the second block 543 are symmetric to each other about the third connection line 59. The term of "symmetric," as indicated in the embodiment, refers to a symmetry of elements in the circuit, where the element can be, for example, an inductor, capacitor, resistor, or diode, but the number of elements which are symmetric may not be the same.

In this embodiment, the first transmission line 51 and the second transmission line 53 (i.e., the first block 541 and the second block 543) are symmetric to each other, and therefore the common mode noise reduction circuit 20 causes no, or only minimum, loss with respect to the differential mode signals, when inputting to the first input end 511 and the second input end 531 and outputting from the first output end 513 and the second output end 533. By incorporating the first resistor 591 and the second resistor 592 in the common mode noise reduction circuit 50, the common mode signals, after entering the circuit, will be transformed into heat. In other words, the common mode signals, after enter the common mode noise reduction circuit 50, will not release from the input ends 511/531 and the output ends 513/533, thereby suppressing the common mode noise.

In one embodiment, the common mode noise reduction circuit 50 further includes at least one fourth connection line 56 provided with at least one sixth two-port element 561 for connecting the first transmission line 51 and the second transmission line 53. One end of the fourth connection line 56 is connected between the first inductors 515 of the first transmission line 51, and the other end of the fourth connection line 56 is connected between the second inductors 535 of the second transmission line 53. For example, when the numbers of the first inductors 515 and of the second inductors 535 are two, one end of the fourth connection line 56 may be connected between the first inductions 515 connected in series, and the other end of the fourth connection line 56 may be connected between the second inductions 535 connected in series. The transmission bandwidth of the differential mode signals in the common mode noise reduction circuit 50 can be adjusted by changing the disposition of the sixth two-port element 561 on the fourth connection line 56.

Figure 6:
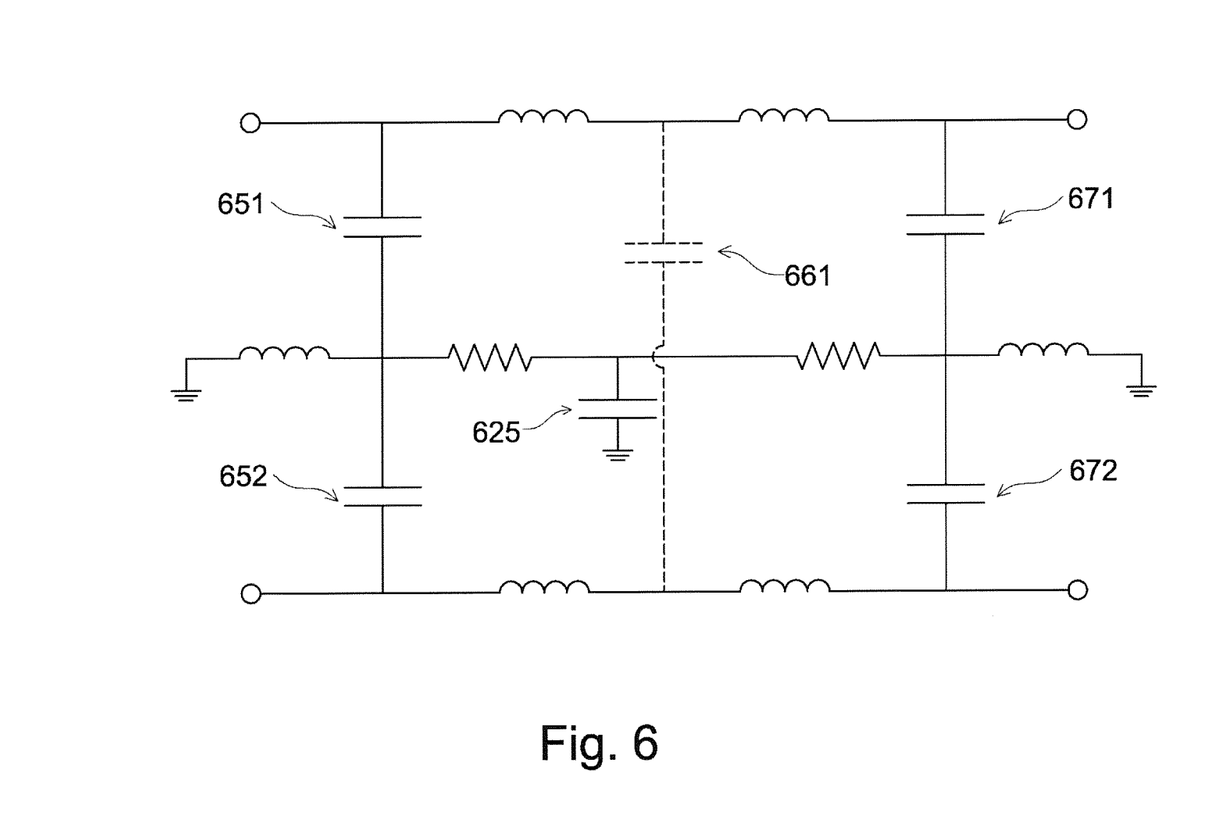
FIG. 6 is a circuit diagram of a common mode noise reduction circuit according to another embodiment of this disclosure.
Figure 7:
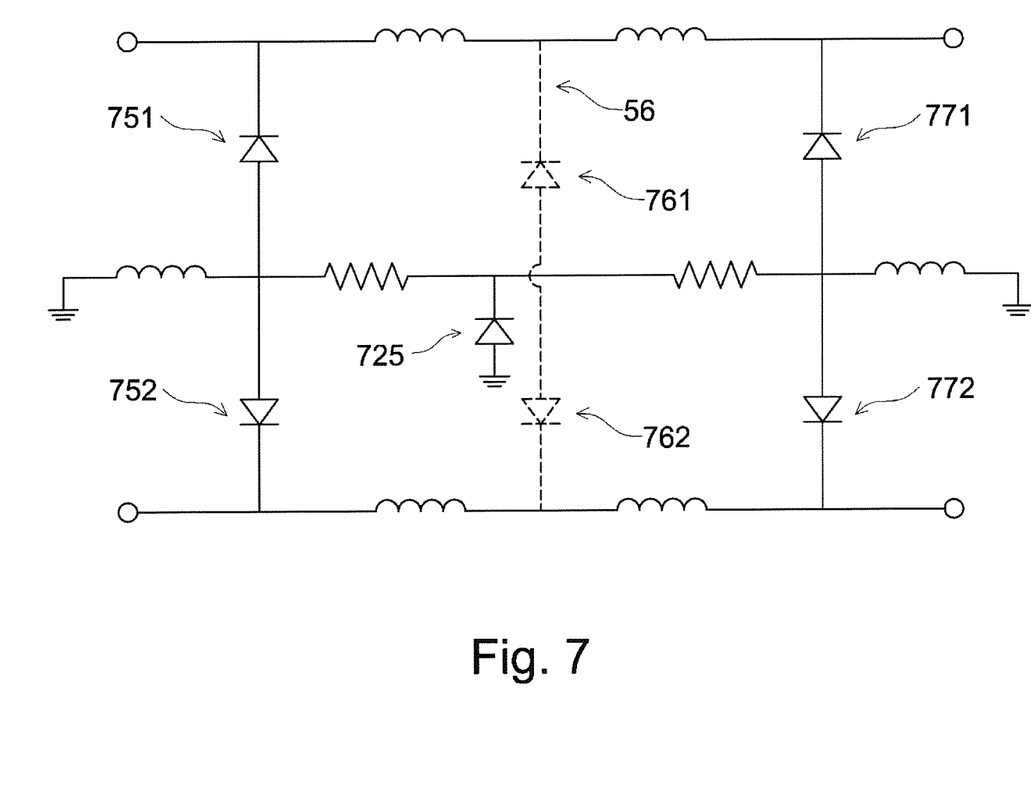
FIG. 7 is a circuit diagram of a common mode noise reduction circuit according to another embodiment of this disclosure.

In this embodiment, the first two-port element 551, the second two-port element 552, the third two-port element 571, the fourth two-port element 572, the fifth two-port element 225, and the sixth two-port element 561 have a capacitive characteristic which may, for example, be a capacitor or diode. In one embodiment, the first two-port element 551, the second two-port element 552, the third two-port element 571, the fourth two-port element 572, the fifth two-port element 225, and the sixth two-port element 561 are the first capacitor 651, the second capacitor 652, the third capacitor 671, the fourth capacitor 672, the fifth capacitor 625, and the sixth capacitor 661, respectively, as shown in FIG. 6, where the first capacitor 651, the second capacitor 652, the third capacitor 671, the fourth capacitor 672, the fifth capacitor 625, and/or the sixth capacitor 661 may, or may not, have the same capacitance. In another embodiment, the first two-port element 551, the second two-port element 552, the third two-port element 571, the fourth two-port element 572, and the fifth two-port element 225 are the first diode 751, the second diode 752, the third diode 771, the fourth diode 772, and the fifth diode 725, respectively. The number of the sixth two-port element 561 on the fourth connection line 56 may be plural. For example, there provides a sixth diode 761 and a seventh diode 762 disposed on the fourth connection line 56, where the first diode 751, the second diode 752, the third diode 771, the fourth diode 772, the fifth diode 725, the sixth diode 761, and the seventh diode 762 may, or may not, be the same diode, as shown in FIG. 7.

Figure 8:
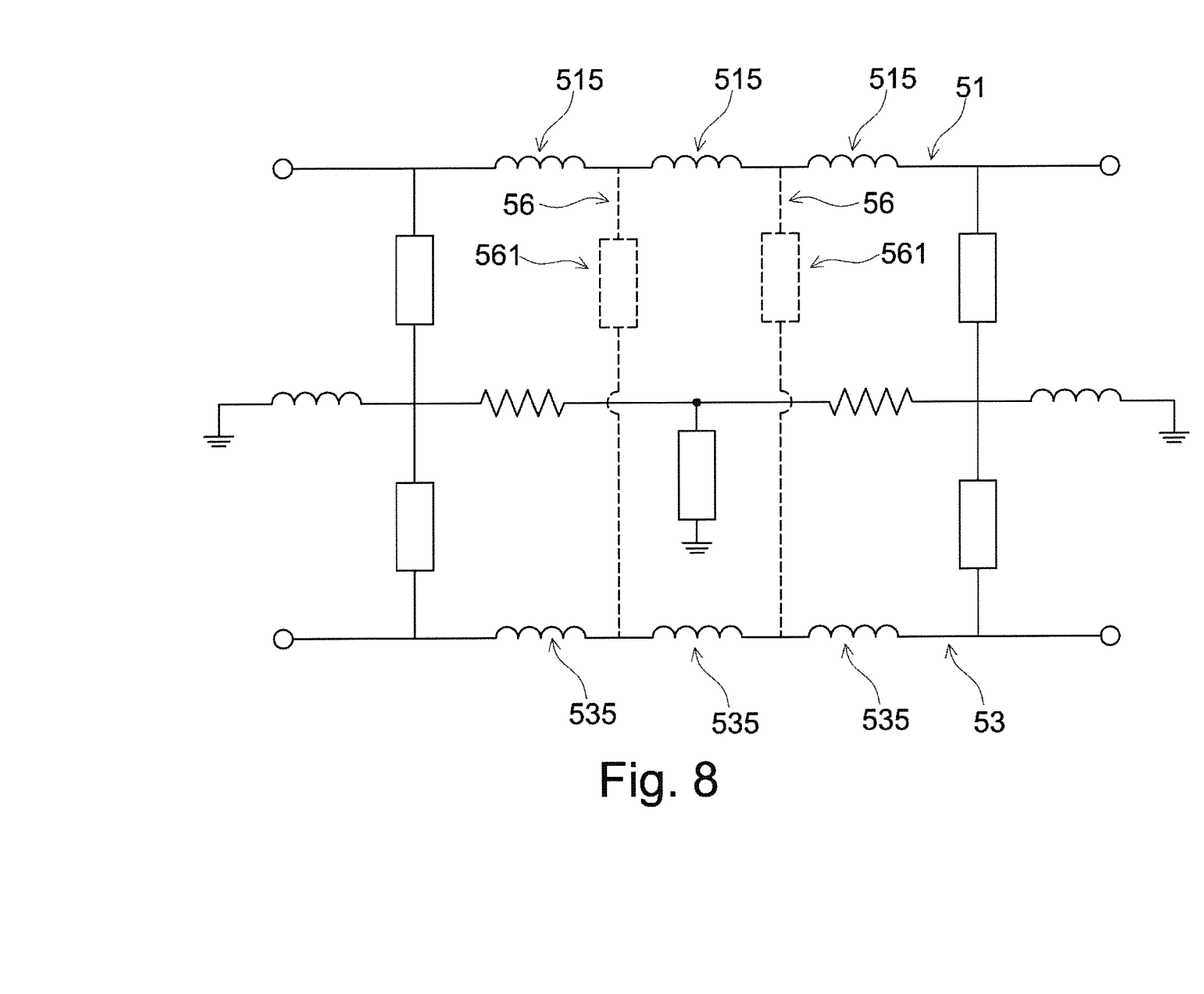
FIG. 8 is a circuit diagram of a common mode noise reduction circuit according to another embodiment of this disclosure.

In one embodiment, as shown in FIG. 8, there provides three or more than three first inductors 515 on the first transmission line 51, and there provides three or more than three second inductors 535 disposed on the second transmission line 53. The number of the fourth connection line 56 may be plural. For example, the number of the fourth connection lines 56 is one less than the number of the first inductors 515, where each fourth connection line 56 includes at least one sixth two-port element 561. Moreover, each fourth connection line 56 has one end connected between two adjacent first inductors 515 on the first transmission line 51, and has the other end connected between two adjacent second inductors 535 on the second transmission line 53.

In this description, the term of "connected" or "connection" refers to any two objects directly or indirectly electrically connected to each other. Therefore, if it is described that "a first element is connected to a second element," the meaning is that the first element is either directly electrically connected to the second element or indirectly electrically connected to the second element through other elements or connection means.

What is claimed is:

1. A common mode noise reduction circuit, comprising:
    a first transmission line, including:
       a first input end;
       a first output end;
       at least one first inductor, disposed between said first input end and said first output end;
    a second transmission line, including:
       a second input end;
       a second output end;
       at least one second inductor, disposed between said second input end and said second output end;
    a first connection line, connected to said first input end and said second input end, and including at least one first two-port element and at least one second two-port element, wherein said first two-port element and said second two-port element are connected in series, and a third inductor is disposed between said first two-port elements and said second two-port elements and connected to a ground end;
    a second connection line, connected to said first output end and said second output end and including at least one third two-port element and at least one fourth two-port element, wherein said third tow-port elements and said fourth two-port elements are connected in series, and a fourth inductor is disposed between said third two-port elements and said fourth two-port elements and connected to a ground end; and
    a third connection line, including at least one first resistor and at least one second resistor, wherein said third connection line has one end connected between said first two-port element and said second two-port element and has the other end connected between said third two-port element and said fourth two-port element, and a fifth two-port element is disposed between said first resistor and said second resistor and connected to a ground end;
    wherein said first two-port element, said second two-port element, said third two-port element, said fourth two-port element, and said fifth two-port element have capacitive characteristics.

2. The common mode noise reduction circuit as of claim 1, wherein said first two-port element, said second two-port element, said third two-port element, said fourth two-port element, and said fifth two-port element are a capacitor or a diode.

3. The common mode noise reduction circuit as of claim 1, wherein said first transmission line, said first two-port element, and said third two-port element combined are referred to as a first block; said second transmission line, said second two-port element, and said fourth two-port element combined are referred to as a second block; and said first block and said second block are symmetric to each other with respect to said third connection line.

4. The common mode noise reduction circuit as of claim 1, wherein said first connection line includes a first node, two sides of said first node are respectively provided with said first two-port element and said second two-port element with equal number, and said first node is connected to a ground end via said third inductor, and wherein said second connection line includes a second node, two sides of said second node are respectively provided with said third two-port element and said fourth two-port element with equal number, and said second node is connected to a ground end via said fourth inductor.

5. The common mode noise reduction circuit as of claim 4, wherein two ends of said third connection line are respectively connected to said first node and said second node.

6. The common mode noise reduction circuit as of claim 5, wherein said third connection line include a third node, two sides of said third node are respectively provided with first resistors and second resistors with equal number, and said third node is connected to a ground end via said fifth two-port element.

7. The common mode noise reduction circuit as of claim 1, wherein said first inductor of said transmission line and said second inductors of said transmission line are mutual inductively coupled.

8. The common mode noise reduction circuit as of claim 1, wherein said first two-port element and said second two-port element are identical, and said third two-port element and said fourth two-port element are identical.

9. A common mode noise reduction circuit, comprising:
a first transmission line, including:
 a first input end;
 a first output end;
 a plurality of first inductors, connected in series and disposed between said first input end and said first output end;
a second transmission line, including:
 a second input end;
 a second output end;
 a plurality of second inductors, connected in series and disposed between said second input end and said second output end;
a first connection line, connected to said first input end and said second input end, and including at least one first two-port element and at least one second two-port element, wherein said first two-port element and said second two-port element are connected in series, and a third inductor is disposed between said first two-port elements and said second two-port elements and connected to a ground end;
a second connection line, connected to said first output end and said second output end and including at least one third two-port element and at least one fourth two-port element, wherein said third two-port element and said fourth two-port element are connected in series, and a fourth inductor is disposed between said third two-port element and said fourth two-port element and connected to a ground end; and
a third connection line, including at least one first resistor and at least one second resistor, said at least one first resistor being connected to said at least one second resistor in series, wherein said third connection line has one end connected between said first two-port element and said second two-port element and has the other end connected between said third two-port element and said fourth two-port element, and a fifth two-port element is disposed between said first resistor and said second resistor and connected to a ground end;
wherein said first two-port element, said second two-port element, said third two-port element, said fourth two-port element, said fifth two-port element have capacitive characteristics.

10. The common mode noise reduction circuit as of claim 9, wherein said first two-port element, said second two-port element, said third two-port element, said fourth two-port element, and said fifth two-port element are a capacitor or a diode.

11. The common mode noise reduction circuit as of claim 9, wherein said first transmission line, said first two-port element, and said third two-port element combined are referred to as a first block; said second transmission line, said second two-port elements, and said fourth two-port elements combined are referred to as a second block; and wherein said first block and said second block are symmetric to each other with respect to said third connection line.

12. The common mode noise reduction circuit as of claim 9, further comprising at least one fourth connection line, said fourth connection line having one end connected between said first inductors of said first transmission line and having the other end connected between said second inductor of said second transmission line, wherein said fourth connection line is provided with at least one sixth two-port element.

13. The common mode noise reduction circuit as of claim 12, wherein the number of said first inductors and the number of said second inductors are three or more than three, the number of said fourth connection lines is plural, and said fourth connection line has one end connected between two adjacent first inductors of said first transmission line, and has the other end connected between two adjacent second inductors of said second transmission line.

14. The common mode noise reduction circuit as of claim 12, wherein said sixth two-port element is a capacitor or a diode.

15. The common mode noise reduction circuit as of claim 9, wherein said first inductors of said first transmission line and said second inductors of said second transmission line are mutual inductively coupled.

16. The common mode noise reduction circuit as of claim 9, wherein said first two-port elements and said second two-port elements are identical, and said third two-port elements and said fourth two-port elements are identical.

* * * * *